United States Patent [19]

Davila

[11] Patent Number: 4,602,191
[45] Date of Patent: Jul. 22, 1986

[54] JACKET WITH PROGRAMMABLE LIGHTS

[76] Inventor: Xavier Davila, 876 E. 180th St., Apt. 5-A, Bronx, N.Y. 10460

[21] Appl. No.: 633,484

[22] Filed: Jul. 23, 1984

[51] Int. Cl.$^4$ .............................................. H01K 7/00
[52] U.S. Cl. ..................................... 315/76; 315/312; 315/316; 362/103; 362/800
[58] Field of Search ............... 362/103, 104, 108, 800, 362/806, 810; 315/76, 312, 316

[56] References Cited

U.S. PATENT DOCUMENTS

| | | | |
|---|---|---|---|
| 3,316,669 | 5/1967 | Nachbar | 428/100 |
| 4,164,008 | 8/1979 | Miller | 362/103 |
| 4,271,408 | 6/1981 | Teshima et al. | 362/800 |
| 4,298,869 | 11/1981 | Okuno | 362/800 |
| 4,308,572 | 12/1981 | Davidson | 362/103 |
| 4,329,625 | 5/1982 | Nishizawa et al. | 362/800 |

*Primary Examiner*—Harold Dixon
*Attorney, Agent, or Firm*—Richard L. Miller

[57] ABSTRACT

A jacket with programmable lights in which apertures are provided in the garment through which tri-color light emitting diodes LED's protrude. The LED's are connected to a flexible printed circuit board which adheres to the inner surface of the garment by means of hook and loop pile type fastener material. The lights are fully programmable as to both their color and their activation. LED's may be provided in a fixed format or in a matrix form which permits alpha-numeric displays or graphic displays. The invention may be used for advertising purposes or entertainment purposes with either a stationary or moving display.

10 Claims, 5 Drawing Figures

JACKET WITH PROGRAMMABLE LIGHTS

BACKGROUND OF THE INVENTION

The present invention relates generally to electronic garment accessories, and, more specifically to illuminated garments which may be used for advertisement or entertainment purposes.

There is a long tradition for carrying advertising slogans upon the human body, usually in the form of placards or garments with pre-printed messages. Until recently, it has not been possible to provide an illuminated garment capable of displaying a multi-colored programmable message.

SUMMARY OF THE INVENTION

It is, therefore, a primary object of the present invention to provide a jacket with programmable lights in which each light emitting point can display three colors.

Another object is to provide a jacket with programmable lights which can be easily fitted to or removed from to any existing garment.

Another object is to provide a jacket with programmable lights in which the flexibility of the garment is substantially retained. This is accomplished using flexible printed circuit boards.

Another object is to provide a jacket with programmable lights in which a circuit module controls the timing and color of the light emitting sources, especially tri-color light emitting diodes.

Another object is to provide a jacket with programmable lights in which the circuit module is programmable by means of several program storage means, including, but not limited to, read only memories, tape mediums, and random access memories programmed by a keyboard.

Another further object is to provide a jacket with programmable lights in which audio frequency signals are amplified and then divided into frequency sub-bands so that the light emitting diode display may follow the beat and timbre of music or speech.

Further objects of the invention will appear as the description proceeds.

To the accomplishment of the above and related objects, this invention may be embodied in the form illustrated in the accompanying drawings, attention being called to the fact, however, that the drawings are illustrative only and that changes may be made in the specific construction illustrated and described within the scope of the appended claims.

BRIEF DESCRIPTION OF THE DRAWING FIGURES

The figures in the drawings are briefly described as follows.

DETAILED DESCRIPTION OF THE PREFERRED EMBODIMENTS

Figure 1:
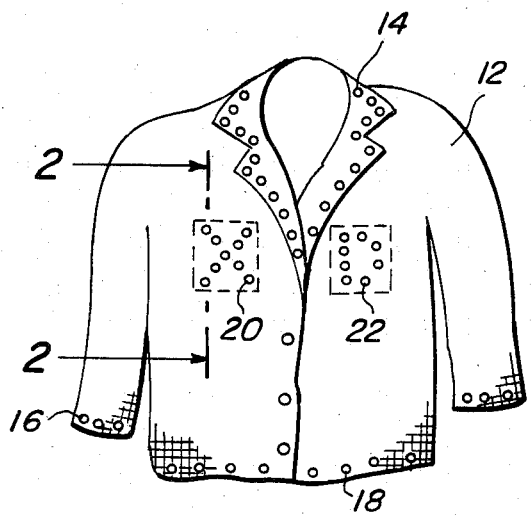
FIG. 1 is a front view of a garment with the invention installed therein.
Figure 2:
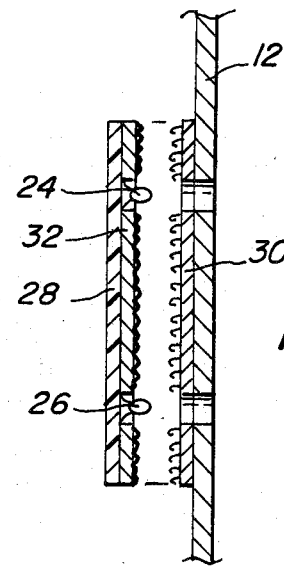
FIG. 2 is a side cross sectional view exploded taken along line 2—2 on FIG. 1.

In FIG. 1, the garment 12 is seen with tri-color light emitting diodes LED's installed along the collar as typified by 14, along the sleeves as typified by 16, along the bottom as typified by 18, and on the pockets typified by the letter "X" at 20 and the letter "D" at 22. All of the LED's protrude through apertures in the garment itself. As seen in FIG. 2, each of the LED's, such as 24 and 26 are connected to a flexible printed circuit board 28 which can easily follow the contours of a body in motion. A piece of hook and loop pile type fastener material 30 is bonded to the underside of the garment 12. A mating piece of hook and loop pile type fastener material 32 is bonded to the top side of the flexible printed circuit board 28 and is used to firmly but removably mate the flexible printed circuit board 28 to the garment 12. Although a single printed circuit is illustrated, it is understood that any number of printed circuit boards may be used.

Figure 3:
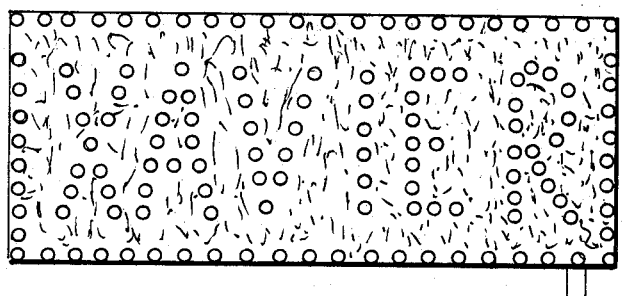
FIG. 3 is a front view of a typical embodiment of the invention before installing in a garment.
Figure 4:
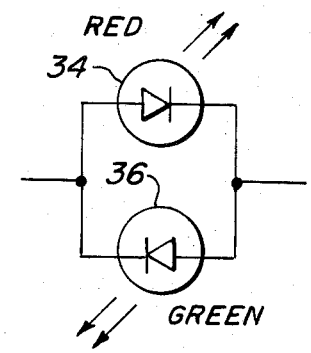
FIG. 4 is a schematic diagram of a typical tri-color light emitting diode intended for use in the invention.

In FIG. 3 a configuration which spells the word "XAVIER" is shown. By properly programming the matrix of LED's any message, even a moving message may be displayed. In FIG. 4 the operation of a diode package that emits three different colors, or tri-color light emitting diode is shown to consist essentially of two different colored diodes, one red 34 and one green 36, connected back-to-back, and contained in a single package. Passing a direct electrical current through the diode package in one direction causes emission of one color. When the current is reversed, a second color is produced. When the package is placed across an alternating current, a third color is produced which is the combination of the first two colors.

Figure 5:
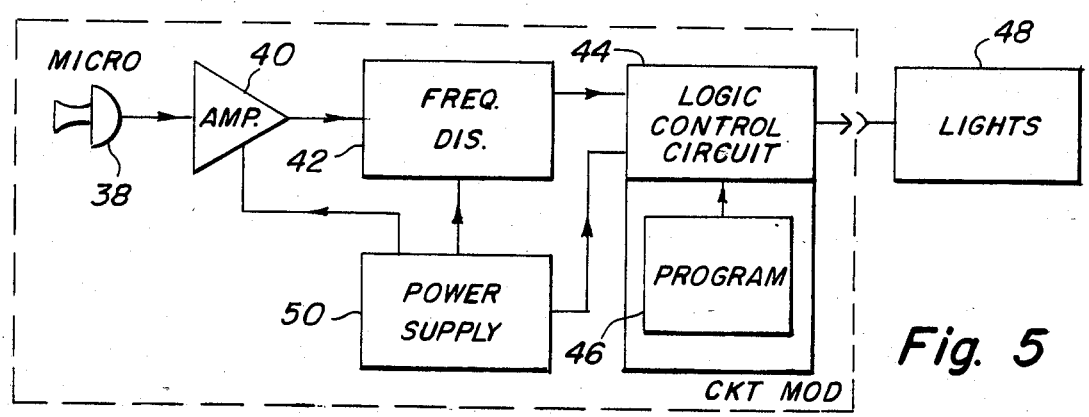
FIG. 5 is a block diagram of the circuit incorporated in one embodiment of the invention making the lights responsive to audio sounds.

In FIG. 5 one embodiment of possible control circuits is illustrated, which may be portably carried in a pocket of the garment. It is understood that there are many possible control circuits which may be provided by anyone skilled in the art without departing from the spirit of the invention. A microphone 38 picks up ambient sounds such as music or speech and an amplifier 40 increases the level of the microphone signal to a useful level. A frequency discriminator 42 divides the audio spectrum from amplifier 40 into a discrete number of signals which are processed by a logic control circuit 44 according to instructions provided by program 46 which may be stored in a read only memory (ROM), a tape medium, a random access memory (RAM) inputted by a keyboard, or any other storage medium. The display of lights 48 will change according to audio inputs to microphone 38. Power to all circuits and to the light emitting diode display 48 is provided by power supply 50.

While certain novel features of this invention have been shown and described and are pointed out in the annexed claims, it will be understood that various omissions, substitutions and changes in the forms and details of the device illustrated and in its operation can be made by those skilled in the art without departing from the spirit of the invention.

What is claimed is:

1. Jacket with programmable lights, comprising, in combination:
    (a) a garment, wherein said garment has apertures through which light emitting devices may protrude;

(b) tri-color light emitting diodes defining diode packages emitting three different colors, arranged in any desired pattern, said tri-color light emitting diodes comprising two different colored diodes oppositely connected in parallel to each other, circuit means providing a current to the diodes whose direction is controllable to be either in a first direction wherein one color is emitted, a reverse direction wherein a second color is emitted, and an alternating direction wherein a third color is emitted which is the combination of the first two colors, and wherein said tri-color light emitting diodes protrude through said apertures in said garment, (c) at least one flexible printed circuit board to which said tri-color light emitting diodes are connected;

(d) a circuit module which programmably controls the emission of said tri-color light emitting diodes, said circuit module comprising a logic control circuit with instructions contained in a program in a storage medium; and (e) means for temporarily affixing said flexible printed circuit board to the underside of said garment.

2. Jacket with programmable lights, as recited in claim 1, wherein said garment is a jacket.

3. Jacket with programmable lights, as recited in claim 1, wherein said desired pattern is a fixed combination of numbers and letters.

4. Jacket with programmable lights, as recited in claim 1, wherein said desired pattern is a matrix which can create any desired alphabetic or numeric pattern.

5. Jacket with programmable lights, as recited in claim 1, wherein said desired pattern is a matrix with sufficient numbers of said tri-color light emitting diodes to create a graphic display.

6. Jacket with programmable lights, as recited in claim 1, wherein said program is contained in an electronic read-only memory.

7. Jacket with programmable lights, as recited in claim 1, wherein said program is contained on a magnetic medium.

8. Jacket with programmable lights, as recited in claim 1, wherein said program is contained in an electronic random access memory which is programmed by a keyboard.

9. Jacket with programmable lights, as recited in claim 1, further comprising a microphone, which drives an amplifier, which drives a frequency discriminator which divides the audio frequency spectrum into a discrete number of channels; wherein, the output of said frequency discriminator is used to drive said logic control circuit so that said tri-color light emitting diodes are activated in accordance with said output signals according to instructions supplied by said program.

10. Jacket with programmable lights, as recited in claim 1, wherein said means for temporarily affixing said flexible printed circuit board to the underside of said garment comprises a region of hook and loop pile type fastener material bonded to the underside of said garment and a mating region of hook and loop pile type fastener material bonded to the top side of said flexible printed circuit board.

* * * * *